United States Patent
Kieslinger et al.

(10) Patent No.: US 10,531,571 B2
(45) Date of Patent: Jan. 7, 2020

(54) METHOD FOR POSITIONING AT LEAST ONE ELECTRONIC COMPONENT ON A CIRCUIT BOARD

(71) Applicant: ZKW GROUP GMBH, Wieselburg (AT)

(72) Inventors: Dietmar Kieslinger, Theresienfeld (AT); Peter Wurm, Eisenstadt (AT); Arianit Idrizaj, Klingenbach (AT)

(73) Assignee: ZKW GROUP GMBH, Wieselburg (AT)

( * ) Notice: Subject to any disclaimer, the term of this patent is extended or adjusted under 35 U.S.C. 154(b) by 185 days.

(21) Appl. No.: 15/568,843

(22) PCT Filed: Apr. 22, 2016

(86) PCT No.: PCT/AT2016/050109
§ 371 (c)(1),
(2) Date: Oct. 24, 2017

(87) PCT Pub. No.: WO2016/176702
PCT Pub. Date: Nov. 10, 2016

(65) Prior Publication Data
US 2018/0110129 A1    Apr. 19, 2018

(30) Foreign Application Priority Data

May 4, 2015    (AT) .............................. A 50357/2015

(51) Int. Cl.
*H05K 3/30*    (2006.01)
*H05K 1/02*    (2006.01)
(Continued)

(52) U.S. Cl.
CPC ............ *H05K 3/303* (2013.01); *F21S 41/141* (2018.01); *F21S 41/192* (2018.01);
(Continued)

(58) Field of Classification Search
CPC ........ H05K 3/303; H05K 13/04; H05K 1/181; H05K 1/0269; H05K 2201/09918;
(Continued)

(56) References Cited

U.S. PATENT DOCUMENTS 6,552,352 B2 * 4/2003 Momose ............... G03F 9/7038
                                                       250/491.1
7,540,080 B2 * 6/2009 Fukunaga ............ G02B 6/4224
                                                       29/743
(Continued)

FOREIGN PATENT DOCUMENTS

| CN | 202587602 U | 12/2012 |
|---|---|---|
| EP | 2983458 A1 | 2/2016 |
| JP | H09-321392 A | 12/1997 |

OTHER PUBLICATIONS

International Search Report and Written Opinion for PCT/AT2016/050109, dated Aug. 16, 2016 (12 pages).

(Continued)

*Primary Examiner* — Donghai D Nguyen
(74) *Attorney, Agent, or Firm* — Eversheds Sutherland (US) LLP

(57) ABSTRACT

A method for positioning at least one electronic component (3) on a circuit board (1) provided for installation in a vehicle headlamp, wherein the circuit board (1) comprises at least one position mark and the at least one electronic component (3) is positioned relative to the at least one position mark on the circuit board (1), wherein the at least one position mark is detected optically and is used for positioning, wherein the at least one position mark used is at least one alignment mark (5, 6, 7, 8, 8', 8") of the circuit board (1) which, in the vehicle headlamp, when the circuit board (1) is installed, interacts mechanically with a posi- (Continued)

Figure 1:
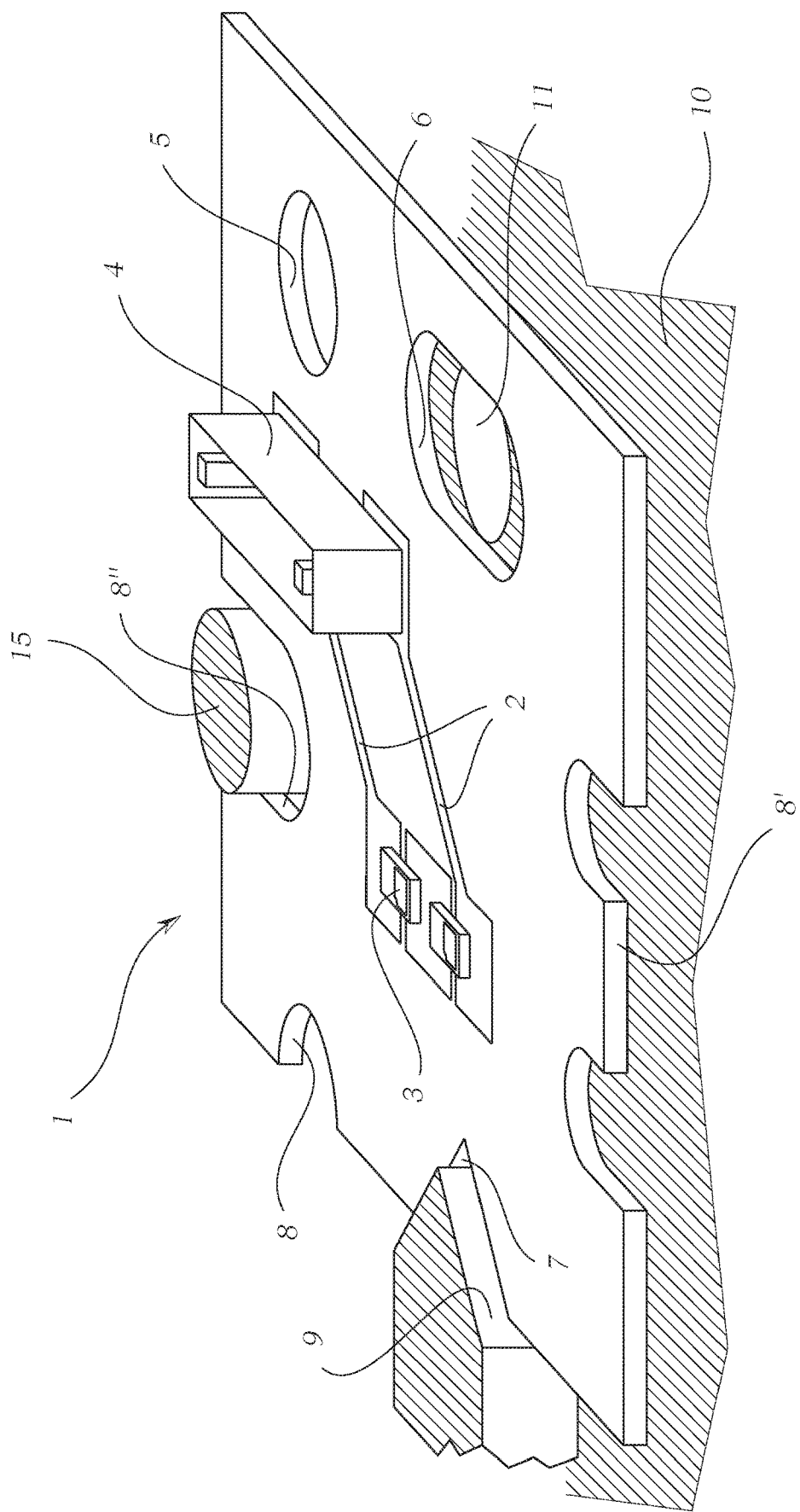

tioning means (9, 15) of the vehicle headlamp that is complementary to the alignment mark (5, 6, 7, 8,8', 8').

12 Claims, 3 Drawing Sheets

(51) Int. Cl.
*F21S 41/19* (2018.01)
*F21S 41/141* (2018.01)
*H05K 1/18* (2006.01)
*H05K 13/04* (2006.01)

(52) U.S. Cl.
CPC .......... *H05K 1/0269* (2013.01); *H05K 1/181* (2013.01); *H05K 13/04* (2013.01); *H05K 2201/09063* (2013.01); *H05K 2201/09163* (2013.01); *H05K 2201/09854* (2013.01); *H05K 2201/09918* (2013.01); *H05K 2201/10106* (2013.01); *Y02P 70/613* (2015.11)

(58) Field of Classification Search
CPC .......... H05K 2201/09854; H05K 2201/09163; H05K 2201/09063; H05K 2201/10106; F21S 41/141; F21S 41/192; Y02P 70/613; Y10T 29/49131
USPC .................................................. 29/832–834
See application file for complete search history.

(56) References Cited

U.S. PATENT DOCUMENTS

| | | |
|---|---|---|
| 2002/0149921 A1 | 10/2002 | Terasaka |
| 2006/0016069 A1 | 1/2006 | Kent et al. |
| 2011/0293168 A1 | 12/2011 | Matsushima et al. |
| 2012/0098020 A1 | 4/2012 | Fukuda et al. |
| 2015/0364384 A1 | 12/2015 | Karch |

OTHER PUBLICATIONS

Search Report issued in Austrian Application No. A 50357/2015, completed Feb. 25, 2016 (1 page).

\* cited by examiner

METHOD FOR POSITIONING AT LEAST ONE ELECTRONIC COMPONENT ON A CIRCUIT BOARD

The invention relates to a method for positioning at least one electronic component on a circuit board for installation in a vehicle headlamp, in which method the at least one electronic component is positioned relative to at least one position mark on the circuit board, wherein the at least one position mark is detected optically, and to a circuit board produced by a method of this kind.

Vehicle headlamps increasingly comprise electronic and in particular semiconductor components, wherein LED technology in particular, in which light-emitting diodes (LEDs) are used as light source for the headlamp, is being used on a large scale. LEDs have a high light yield and are characterised by a small spatial requirement compared to conventional light sources such as halogen lamps. The LEDs are generally fixed on circuit boards or printed circuit boards, which also have suitable conducting tracks for supplying power to the LEDs, and are fixed on the circuit boards using fitting methods known in the field of circuit board construction.

With use of LEDs as light sources for vehicle headlamps, extremely low tolerances with regard to the positioning of the LEDs in relation to the optical component parts associated with the LEDs, such as reflectors and/or lenses, must be observed, since the legislators for LEDs, which have an extremely high luminosity, stipulate precise requirements with regard to the produced light image so as to avoid dazzling oncoming traffic when the vehicle headlamp is in operation. In the prior art it is therefore necessary, on account of the manufacturing inaccuracies that routinely occur with conventional circuit board construction technology, to adjust component parts such as reflectors and/or lenses depending on the actual position of the LEDs or the light sources on the circuit board or printed circuit board. The tolerances that occur when fitting LEDs and similar light sources, such as laser diodes, therefore lead, for headlamp manufacturers, to the need to empirically determine the necessary relative position of reflectors and/or lenses and to fix the optical elements in this specific position. Whereas the production of circuit boards is a largely automated process and therefore can be carried out quickly and in high numbers and therefore extremely economically, the adjustment of a headlamp in respect of the relative position of light sources and optical elements such as reflectors and/or lenses involves a large amount of work, which conflicts with the requirement of efficient and economical headlamp production.

A significant reason for the relative inaccuracy of the positioning of light sources on a circuit board or printed circuit board for use in a vehicle headlamp is based in particular on the fact that, even with extremely accurate manufacture of the printed circuit board in respect of the conducting tracks and the position of the light sources, it is not possible to produce possibilities for fastening the circuit board to the vehicle headlamp, generally speaking edge portions or alignment marks of the circuit board such as edges, notches and/or bores, with the same precision as the production of conducting tracks and contact pads for light sources such as LEDs or laser diodes. In the case of conventional referencing possibilities for light sources and fastening possibilities, which are based on position marks, which, similarly to the conducting tracks, are applied to a circuit board or are etched or printed on a circuit board, errors are created when positioning the fastening possibilities on the one hand and when assembling the light sources on the other hand. Such referencing possibilities therefore cannot lead to the desired precise results, since, on account of said inaccuracy of the position of the fastening structures of the circuit board, an intrinsic inaccuracy at the time of fixing to the vehicle headlamp results, which in turn means that optical elements such as reflectors and/or lenses have to be subsequently adjusted in order to attain the desired light image.

The object of the invention is therefore to eliminate the described shortcomings and to improve a method of the type described in the introduction insofar as a subsequent positioning or adjustment of optical elements such as reflectors and/or lenses once components have been fitted on a circuit board and this has been fixed in a vehicle headlamp can be spared, so that vehicle headlamps can be produced in a manner that is automated to the greatest possible extent.

In order to achieve this object, a method of the type described in the introduction is developed in accordance with the invention to such an extent that the at least one position mark used is at least one alignment mark of the circuit board which, in the vehicle headlamp, when the circuit board is installed, interacts mechanically with a positioning means of the vehicle headlamp that is complementary to the alignment mark. As already mentioned, alignment marks of the circuit board are used in particular for the mechanical positioning and/or fixing of the circuit board on the vehicle headlamp. In particular, recesses in the circuit board which are formed in edge portions, that is to say at edges which delimit the circuit board, and can comprise mechanical markings, for example in the form of notches, are suitable as alignment marks. For example, bores through which a delimiting edge can run are also suitable. Bores which are formed entirely within the circuit board are suitable in principle as alignment marks. Mechanical positioning means can be formed as pins, stops and the like, which are provided on corresponding component parts of a vehicle headlamp in order to interact with correspondingly shaped alignment marks of the circuit board so as to define an orientation and position of the circuit board on or in the vehicle headlamp. If, in accordance with the invention, an alignment mark of this kind of the circuit board provided for interaction with mechanical positioning means is used as position mark, which is detected in order to position an electronic component relative to this position mark, a key source for inaccuracies in the production of a vehicle headlamp is thus eradicated, since the at least one electronic component, for example an LED (light-emitting diode), is referenced relative to an alignment mark which, when the circuit board carrying this electronic component is in the installed state, determines the actual position in the vehicle headlamp and therefore relative to further optical elements such as reflectors and/or lenses, which interact with the electronic component for the resultant light image of the vehicle headlamp. On the whole, the application of the method according to the invention eradicates a potential error source in respect of the positioning of electronic components, so that on the whole a greater precision is achieved, and in particular the effort involved in a subsequent alignment of optical components can be avoided.

Since, for the positioning of electronic components on the circuit board, the interaction with positioning means of a vehicle headlamp is essential, it is clear that the circuit board can interact particularly well with the positioning means, in other words can be assembled in a vehicle headlamp in a particularly fixed and precise manner, for example in order to be secured against twisting, if at least two alignment marks are used for assembly and consequently also for positioning. The circuit board can be held particularly precisely by interacting in the form of a mechanical connection with the positioning means at least at two locations. If at least two alignment marks are used for positioning, the alignment marks themselves can be formed particularly easily, for example as notches, and allow simple assembly in a vehicle headlamp.

With use of just one alignment mark during the course of the positioning process, a precise alignment of the circuit board, in particular in the case of smaller circuit boards, with respect to an installed position in a vehicle headlamp is also possible in principle. In the case of larger circuit boards, it is advantageous if at least two alignment marks are used for positioning in order to obtain the greatest precision possible, which in particular can be achieved if at least two alignment marks on the circuit board are used for the method according to the invention, which preferably lie on the circuit board on opposite edges or edge regions, preferably on the longest opposite edges of the circuit board if the circuit board has a substantially rectangular shape. Here, a substantially rectangular shape means that rounded corners or other shape adaptations of the circuit board for installation in a vehicle headlamp can by all means be provided, however the basic shape of the circuit board follows the course of a rectangle for the most part.

For the subsequent implementation of automated production of the circuit board according to the invention, the method according to the invention can be characterised preferably in that the at least one alignment mark is detected optically from a first side of the circuit board, in particular using a camera, and, on the basis of position data of the at least one alignment mark, a data record comprising a fitting position for the at least one component is created and is made available to a machine for fitting electronic components. Camera-assisted methods of this kind for detecting visible structures are known in the prior art and can also be applied readily to alignment marks such as holes, slots, edges, and notches of a circuit board, wherein digital image capture, which is nowadays standard, offers the possibility to create data records with a fitting position for the at least one component in a fully automated manner.

In order to improve the optical detection of the alignment mark of the circuit board and in particular the optical detection with a camera, the method according to the invention is preferably developed to such an extent that the circuit board is illuminated from a second side opposite the first side. The illumination of the circuit board from the second side, which is opposite the first side from which the circuit board can be detected optically using a camera, leads to a significant increase of the contrast at edge regions or at the alignment marks of the circuit board, so that alignment marks and therefore also alignment marks which are provided for the interaction with mechanical positioning means for the circuit board on the vehicle headlamp can be much better recognised.

Generally speaking, circuit boards are produced by cutting, milling, punching and/or drilling in order to produce edges and therefore also in order to produce alignment marks for interaction with mechanical positioning means, whereby, on closer inspection, alignment marks of this kind are by no means constituted by practically ideal, smooth edges or even surfaces, but by contrast often have large irregularities. However, since in the end an irregular course of precisely this type of the alignment marks is relevant for the actual position of the circuit board in the vehicle headlamp, it must be detected optically as precisely as possible in accordance with the method according to the invention in order to attain the greatest possible precision when positioning the electronic components. The method according to the invention is therefore preferably developed insofar as the illumination is performed using light directed in parallel. The illumination with light directed in parallel from the second side and the detection of the light directed in parallel at the edge portion or at the alignment mark, in particular by means of a camera, projects, with the greatest possible precision, on account of the absence of divergent light components, the edge of the alignment mark that is actually effective, so that a rather accurate referencing of the electronic component with respect to the alignment mark effective in the installed position of the circuit board can be provided. In addition, the method according to the invention is independent of any unevennesses of the surface on the first side of the circuit board, whereas, when determining a position by means of microscopic methods, the relevant focusing plane cannot always be determined unambiguously on account of tapering layers of metal and lacquer in the edge region of the circuit board.

For a further improved positioning of the at least one electronic component on the circuit board, an approach is preferably adopted such that a plurality of position marks of a circuit board are detected. In this regard, it is clear to a person skilled in the art that the degree of determination of the positioning of the at least one electronic component increases with the number of detected position marks, although in some circumstances it is by all means conceivable to also detect only one position mark and to use this for the positioning of an electronic component on a circuit board.

The method according to the invention is preferably performed in such a way, in particular for cost reduction, that a plurality of circuit boards are produced on a common panel and the at least one position mark is detected when the circuit boards have not yet been separated from one another, which corresponds to the execution of the method according to the invention within the scope of production methods that are routine in the field of circuit board technology. Specifically, it is standard within the field of circuit board technology to produce, on a common plate, a multiplicity of circuit boards or printed circuit boards, i.e. functional units, which are referred to at the end of the production process as a circuit board or printed circuit board. A plate of this kind, wherein a plurality of functional units are connected to one another and are only separated by subsequent processing steps such as cutting, milling or punching, is referred to by a person skilled in the art in the field in question as panels, wherein a panel, after production of the various conducting tracks and after positioning or application of the electronic components, in accordance with the invention with detection of alignment marks provided for interaction with mechanical positioning means, is cut to size or divided so as to produce the functional units, i.e. the circuit boards or printed circuit boards. The method according to the invention makes it possible to already provide an accurate positioning of the electronic components if the circuit boards are still consolidated in the form of a common panel, so that the fitting and positioning of the electronic components according to the invention can be performed in machines designed for the processing and working of large panels and which are usually used in the case of a circuit board production process.

It is particularly advantageous to achieve a high positioning precision if more than one circuit board is manufactured on the common panel and the alignment marks are arranged in the panel in such a way that they are severed at the time of separation of the circuit boards, for example by sawing, and only after this separation form a notch or generally an indentation at an edge. The indentation can have any arbitrary shape in principle that is suitable for mechanically interacting with the positioning means.

Here, an approach is preferably adopted such that in each case at least one position mark is detected for each circuit board on the common panel, so that the position mark actually relevant for the positioning of the circuit board in the vehicle headlamp at the time of installation in the vehicle headlamp or the relevant alignment mark of the circuit board is used for the exact positioning of the at least one electronic component.

As already described above in conjunction with the procedure according to the invention in the case of an individual circuit board, an approach can be adopted also when processing circuit boards on a common panel such that a plurality of position marks are detected for a component to be positioned for each circuit board on the common panel and are used to create a data record with a fitting position for the component, as corresponds to a preferred embodiment of the present invention.

As also already explained a number of times further above, the method according to the invention is used particularly expediently for the production of vehicle headlamps, so that the method according to the invention is preferably developed insofar as the electronic component is selected from the group consisting of an SMD component, an LED, a laser diode and a photodiode. An SMD component is also known to a person skilled in the art as an SMD (surface mounted device).

Since, in a production line for circuit boards, the processing tools are usually arranged on just one side of the circuit board, which passes through the production line, in the method according to the invention the optical detection is also performed from the side on which conducting tracks and electronic components are applied to the circuit board using the aforesaid tools. In other words, this means that the method according to the invention is preferably developed insofar as the first side of the circuit board is the side of the circuit board on which the at least one electronic component is positioned.

Figure 2:
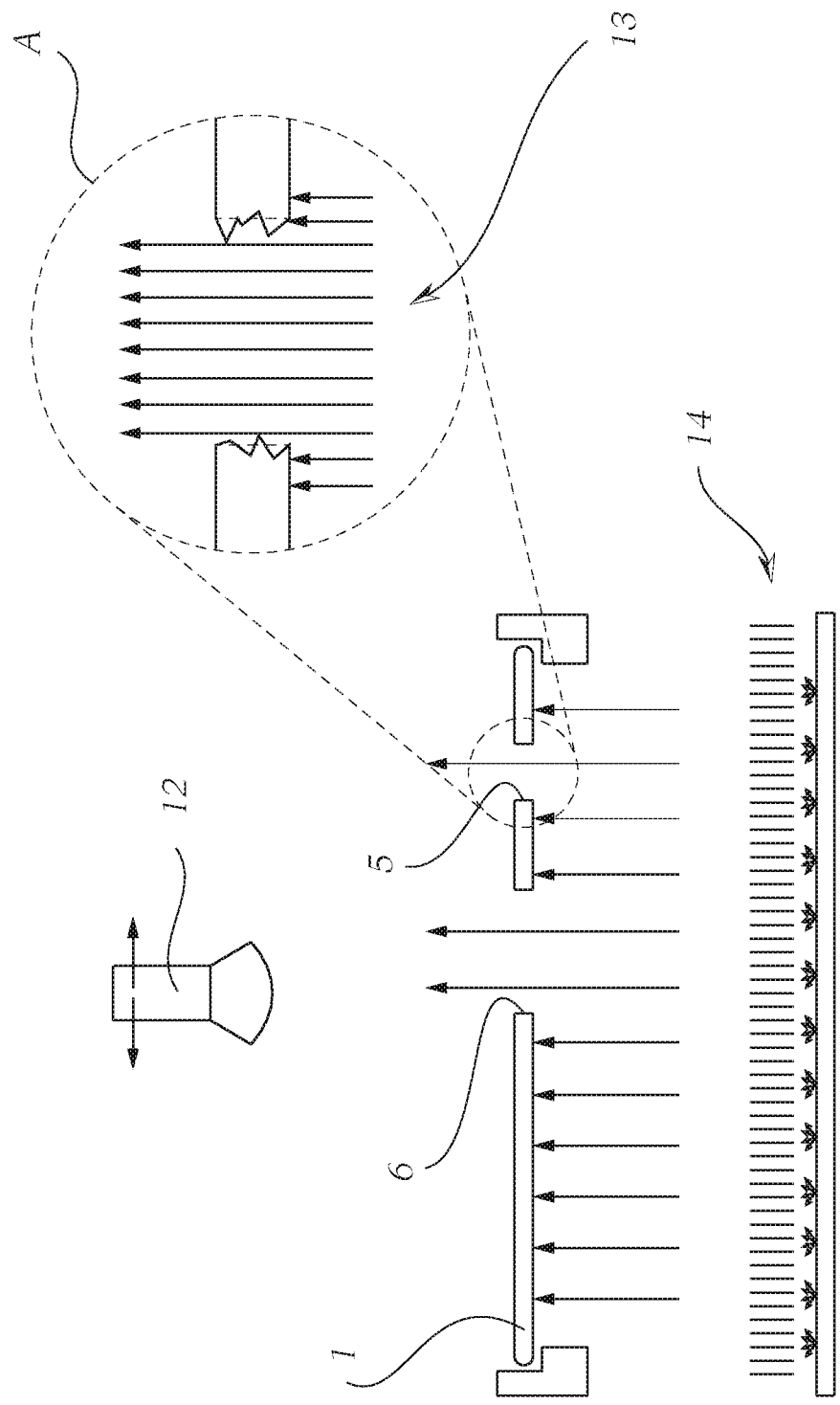
Figure 3:
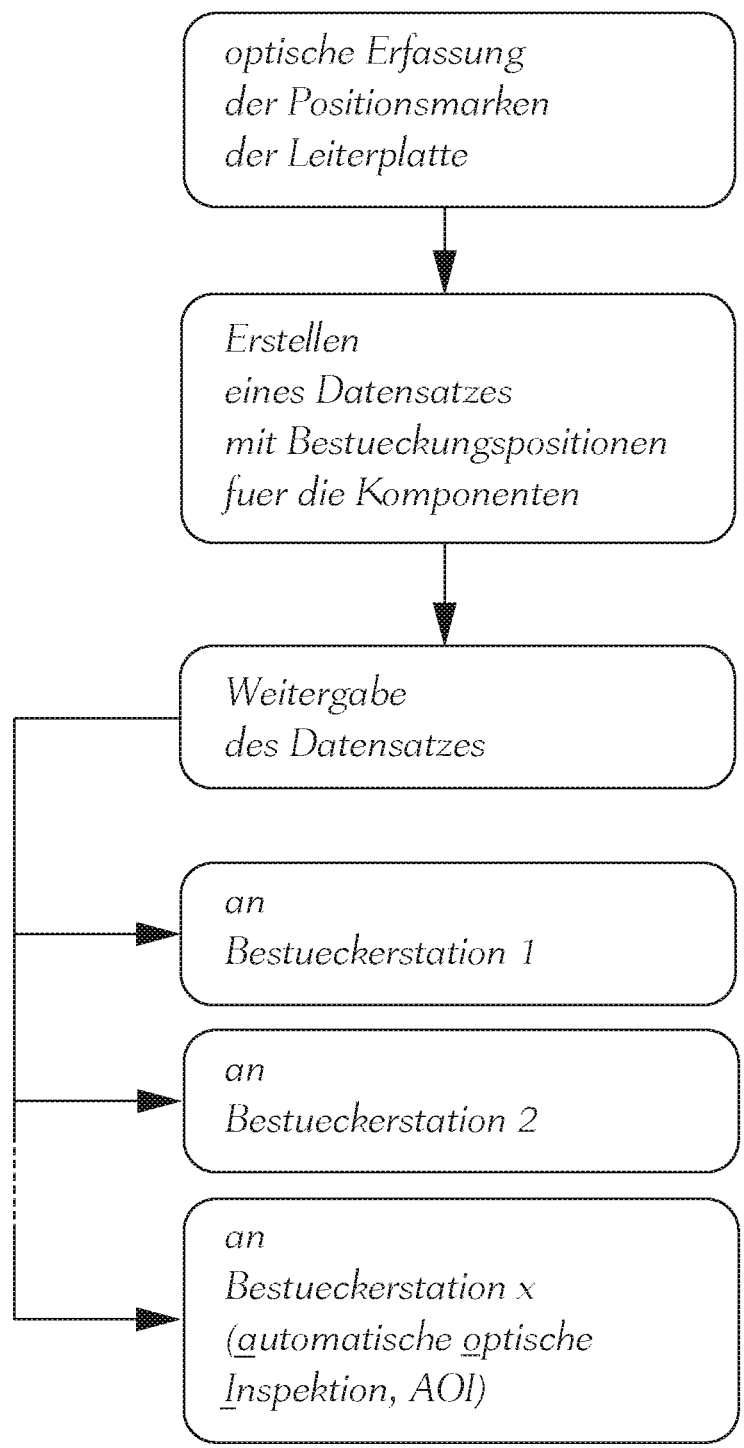

The invention will be explained in greater detail hereinafter on the basis of an exemplary embodiment illustrated schematically in the drawing, in which FIG. 1 shows a schematic plan view of a circuit board with a plurality of electronic components and a plurality of conceivable alignment marks, which can be used as position marks for carrying out the method according to the invention, FIG. 2 shows a schematic illustration of a portion of a production line for carrying out the method according to the invention, and FIG. 3 shows a flow diagram of the method according to the invention.

In FIG. 1 a circuit board is denoted by reference sign 1. The circuit board 1 has a plurality of conducting lines 2 and a plurality of electronic components 3, wherein the conducting lines 2 connect the electronic components 3 to a connector region 4, which in turn is connected to an electrical system (not illustrated) of a vehicle. The printed circuit board 1 can now have a plurality of position marks, wherein the position marks are formed in accordance with the invention by an alignment mark of the circuit board, which alignment mark is provided for interaction with mechanical positioning means for the circuit board on the vehicle headlamp. The hole 5, the slot 6, the notch 7 and the indentations 8, 8', 8" can thus form alignment marks of the circuit board. In order to explain the invention, a plurality of alignment marks of this type are indicated in the example according to FIG. 1. However, it is clear that fewer or more alignment marks of this kind as well as alignment marks of different design can be used as position marks in order to realise the method according to the invention, provided they interact with corresponding mechanical positioning means for the circuit board on the vehicle headlamp only when the circuit board 1 is fixed in position. In FIG. 1 a pin 15 and a stop 9 are illustrated in the section by way of example, wherein the pin 15 and the stop 9 can be formed for example in one piece with a heat sink 10 (not illustrated in greater detail) of a vehicle headlamp. Alternatively, it is also conceivable that a screw (not illustrated) for example interacts with the hole 5 or the slot 6, for which purpose a corresponding threaded opening 11 is provided in the heat sink 10. In accordance with the invention, the alignment marks formed by the hole 5, the slot 6, the notch 7 and/or the indentations 8, 8', 8" are now detected, and the positions of the individual components relative to these alignment marks are defined.

In the method according to the invention at least one electronic component 3 is positioned on a circuit board 1 intended for installation in a vehicle headlamp.

Here, the circuit board 1 comprises at least one position mark, and the at least one electronic component 3 is positioned relative to the at least one position mark on the circuit board 1. The at least one position mark is detected optically and used for positioning.

At least one alignment mark 5, 6, 7, 8, 8', 8" of the circuit board 1 is used as at least one position mark and, in the vehicle headlamp, when the circuit board 1 is installed, interacts mechanically with a complementary alignment mark 9, 15 of the vehicle headlamp.

In FIG. 2 for example the alignment mark formed by the hole 5 and the slot 6 is provided with a camera 12 for optical detection, wherein, in order to increase the contrast at the alignment marks, the circuit board 1 is illuminated from the second side, which is opposite the first side.

The light passes through the recesses, which form the alignment marks, so that the camera is provided with optimal contrast values between the light passing through the circuit board and the light shielded by the circuit board for detection of the alignment marks of the circuit board.

The detail A of FIG. 2 on the one hand shows that the edges or the alignment marks of the circuit board in no way have an ideal course and instead can have irregularities, roughnesses and jagged edges, so that light directed in parallel, which is symbolised by the multitude of arrows 13, can be used particularly advantageously to reliably detect the edge of the alignment mark of the circuit board that is actually effective. The light directed in parallel is generated in a production line by the use of a collimator 14.

FIG. 3 again shows an overview of the entire course of the method. For the positioning of the electronic components or the LEDs or laser diodes, the position marks of the circuit board are detected optically, wherein these position marks in accordance with the invention are alignment marks of the circuit board which are provided for interaction with mechanical positioning means of the vehicle headlamp. A data record with a fitting position for the component is created from the position or the position data of the at least one alignment mark, and the data record is forwarded or made available to a fitting machine. A fitting machine can comprise a plurality of fitter stations. At the end of the method, an output check is performed in the form of an automatic optical inspection (AOI).

The invention claimed is:

1. A method for positioning at least one electronic component (3) on a circuit board (1) intended for installation in a vehicle headlamp, the method comprising:
    providing the circuit board (1) which comprises at least one position mark;
    optically detecting the at least one position mark; and
    positioning, based on the at least one position mark, the at least one electronic component (3) on the circuit board (1),
    wherein the at least one position mark comprises at least one alignment mark (5, 6, 7, 8, 8', 8") on the circuit board (1) which, when the circuit board is installed in the vehicle headlamp, interacts mechanically with a positioning element (9, 15) of the vehicle headlamp that is complementary to the at least one alignment mark (5, 6, 7, 8, 8', 8'),
    wherein the at least one alignment mark (5, 6, 7, 8, 8', 8") is detected optically from a first side of the circuit board (1) using a camera (12),
    wherein based on position data of the at least one alignment mark (5, 6, 7, 8, 8', 8"), a data record with a fitting position for the at least one electronic component (3) is created and is made available to a machine for fitting the at least one electronic component (3), and
    wherein the circuit board (1) is illuminated from a second side opposite the first side.

2. The method according to claim 1, wherein at least two alignment marks (5, 6, 7, 8, 8', 8") on the circuit board (1) are used for positioning the at least one electronic component (3).

3. The method according to claim 2, wherein the at least two alignment marks (5, 6, 7, 8, 8', 8") are disposed on opposite edges of the circuit board (1).

4. The method according to claim 1, wherein the circuit board (1) has a substantially rectangular shape with short and long edges and the at least two alignment marks (5, 6, 7, 8, 8', 8") are disposed on the long edges of the circuit board (1).

5. The method according to claim 1, wherein the circuit board is illuminated using light (13) directed in parallel to one another.

6. The method according to claim 1, wherein a plurality of position marks of the circuit board (1) are detected.

7. The method according to claim 1, wherein a plurality of circuit boards (1) are produced on a common panel and the at least one position mark is detected when the plurality of circuit boards (1) have not yet been separated from one another.

8. The method according to claim 7, wherein the at least one position mark is detected for each circuit board (1) of the plurality of circuit boards on the common panel.

9. The method according to claim 8, wherein a plurality of position marks for the at least one electronic component (3) to be positioned is detected for each circuit board of the plurality of circuit boards on the common panel and is used to create a data record with a fitting position for the at least one electronic component (3).

10. The method according to claim 1, wherein a plurality of circuit boards (1) are produced on a common panel and the at least one alignment mark (6, 7, 8, 8', 8") is disposed at an edge of the circuit board (1) only once the circuit board (1) has been separated from the plurality of circuit boards on the common panel.

11. The method according to claim 1, wherein the at least one electronic component (3) is selected from an SMD component, an LED, a laser diode, and a photodiode.

12. The method according to claim 1, wherein the at least one electronic component (3) is positioned on the first side of the circuit board.

* * * * *